(12) United States Patent
Radomski et al.

(10) Patent No.: US 9,214,909 B2
(45) Date of Patent: Dec. 15, 2015

(54) HIGH RELIABILITY RF GENERATOR ARCHITECTURE

(75) Inventors: Aaron T. Radomski, Wyoming, NY (US); Jonathan Smyka, Scottsville, NY (US); Daniel J. Lincoln, Brockport, NY (US); Yogendra Chawla, Pittsford, NY (US); David J. Coumou, Webster, NY (US); Vadim Lubomirsky, Rochester, NY (US)

(73) Assignee: MKS Instruments, Inc., Andover, MA (US)

( * ) Notice: Subject to any disclaimer, the term of this patent is extended or adjusted under 35 U.S.C. 154(b) by 1994 days.

(21) Appl. No.: 11/460,409

(22) Filed: Jul. 27, 2006

(65) Prior Publication Data

US 2007/0024362 A1 Feb. 1, 2007

Related U.S. Application Data

(60) Provisional application No. 60/704,041, filed on Jul. 29, 2005.

(51) Int. Cl.
*H01Q 11/12* (2006.01)
*H04B 1/04* (2006.01)
*H03F 3/60* (2006.01)
*H03F 1/02* (2006.01)
(Continued)

(52) U.S. Cl.
CPC .............. *H03F 3/602* (2013.01); *H03F 1/0277* (2013.01); *H03F 1/52* (2013.01); *H03F 1/526* (2013.01); *H03F 3/211* (2013.01); *H03F 2200/451* (2013.01)

(58) Field of Classification Search
USPC ................ 455/127.1, 424, 425, 456.5, 456.6, 455/550.1, 575.1, 561, 13.4, 522, 67.14, 455/67.11, 343.1; 330/124 R, 207 R, 127, 330/136, 285, 279, 297; 375/297, 312
See application file for complete search history.

(56) References Cited

U.S. PATENT DOCUMENTS 4,523,155 A * 6/1985 Walczak et al. ............... 330/279
4,739,389 A * 4/1988 Goedbloed .................... 257/664
(Continued)

FOREIGN PATENT DOCUMENTS

CN 1380744 A 11/2002
CN 1607723 A 4/2005
(Continued)

OTHER PUBLICATIONS

Notification of the First Office Action for Chinese Patent Appln. No. 200610109041.X dated Dec. 9, 2010.
(Continued)

*Primary Examiner* — Ankur Jain
(74) *Attorney, Agent, or Firm* — Harness, Dickey & Pierce, P.L.C.

(57) ABSTRACT

A scalable radio frequency (RF) generator system including at least one power supply, at least one power amplifier receiving input from the power supply, and a power supply control module, and a system controller. Output from the at least one power supply can be combined and applied to each of the power amplifiers. Output form each of the at least one power amplifiers can be combined to generate a single RF signal. A compensator module controls operation of the at least one power supply. The compensator module, system control module, and power supply controller communicate in a daisy chain configuration.

13 Claims, 3 Drawing Sheets

(51) Int. Cl.
*H03F 1/52* (2006.01)
*H03F 3/21* (2006.01)

(56) References Cited

U.S. PATENT DOCUMENTS

| | | | |
|---|---|---|---|
| 4,760,347 A * | 7/1988 | Li et al. | 330/127 |
| 5,054,116 A * | 10/1991 | Davidson | 455/126 |
| 5,101,173 A * | 3/1992 | DiPiazza et al. | 330/136 |
| 5,287,555 A * | 2/1994 | Wilson et al. | 455/115.1 |
| 5,354,413 A | 10/1994 | Smesny et al. | |
| 5,371,478 A * | 12/1994 | Ueda | 330/285 |
| 5,508,446 A | 4/1996 | Hayashi et al. | |
| 5,561,395 A * | 10/1996 | Melton et al. | 330/2 |
| 5,652,547 A * | 7/1997 | Mokhtar et al. | 330/279 |
| 5,994,965 A * | 11/1999 | Davis et al. | 330/295 |
| 6,043,706 A * | 3/2000 | Nowak et al. | 330/2 |
| 6,055,418 A * | 4/2000 | Harris et al. | 455/91 |
| 6,124,758 A * | 9/2000 | Korte et al. | 330/124 R |
| 6,236,284 B1 * | 5/2001 | Duello et al. | 332/149 |
| 6,311,044 B1 * | 10/2001 | Wilde et al. | 455/73 |
| 6,522,121 B2 | 2/2003 | Coumou | |
| 6,580,321 B1 * | 6/2003 | Arell et al. | 330/207 P |
| 6,756,849 B2 * | 6/2004 | Dupuis et al. | 330/279 |
| 7,400,201 B2 * | 7/2008 | Kim | 330/296 |
| 2002/0158689 A1 * | 10/2002 | Harris et al. | 330/129 |
| 2003/0215373 A1 | 11/2003 | Reyzelman et al. | |
| 2004/0097915 A1 | 5/2004 | Refior et al. | |
| 2004/0114399 A1 | 6/2004 | Lincoln et al. | |
| 2005/0242882 A1 * | 11/2005 | Anderson | 330/285 |
| 2007/0024372 A1 * | 2/2007 | Hagen | 330/297 |
| 2007/0182490 A1 * | 8/2007 | Hau et al. | 330/297 |
| 2009/0044031 A1 * | 2/2009 | Vinayak et al. | 713/300 |

FOREIGN PATENT DOCUMENTS

| | | | |
|---|---|---|---|
| JP | 2000092412 A | 3/2000 | |
| JP | 2002009637 A | 1/2002 | |
| JP | 2002314440 A | 10/2002 | |
| JP | 2002330558 A | 11/2002 | |
| JP | 2005527078 | 9/2005 | |
| JP | 2006506172 | 2/2006 | |
| WO | 02/03580 A2 | 1/2002 | |
| WO | 03090790 A2 | 11/2003 | |
| WO | 2005011109 A1 | 2/2005 | |

OTHER PUBLICATIONS

Notice of Preliminary Rejection for South Korean Patent Appln No. 9-5-2010-040779914 dated Sep. 14, 2010. (English translation).

Notification of Reason for Refusal for Japanese Patent Appln. No. 2006-207216 dated Sep. 30, 2010 (English translation).

Notice of Preliminary Rejection for South Korean Patent Application No. 9-5-2011-025089787 dated May 7, 2011.

Notification of the Second Office Action for Chinese Patent App. No. 200610109041.X dated Sep. 1, 2011.

Japanese Notification of Reason for Refusal for Japanese Patent Application No. 2006-207216, dated Aug. 4, 2009 (English translation).

Japanese Notification of Reason for Refusal dated Sep. 25, 2012 for Japanese patent application No. 2011-084117.

Extended European Search Report and Opinion for Application No. 10180410.2 dated Sep. 9, 2013.

European Search Report for Application No. 10180410.2-1810/2276169 dated May 24, 2013.

Eroglu, A., et al.: "Class E Amplifier with Inductive Clamp Circuit", 2005 IEEE Radio Frequency Integrated Circuits (RFIC) Symposium; Jun. 12-14, 2005; Long Beach, CA, USA, IEEE, Piscataway, NJ, USA, Jun. 12, 2005, pp. 429-432, XP010823163.

Japanese Office Action for Application No. 2011-84117 dated May 13, 2014, and its English translation thereof.

Extended Search Report for European Patent Application No. 10180421.9, dated Apr. 8, 2013.

* cited by examiner

HIGH RELIABILITY RF GENERATOR ARCHITECTURE

CROSS-REFERENCE TO RELATED APPLICATIONS

This application claims the benefit of U.S. Provisional Application No. 60/704,041, filed on Jul. 29, 2005. The disclosure of the above application is hereby incorporated herein by reference in its entirety.

FIELD

The present disclosure relates to radio frequency (RF) power generators.

BACKGROUND

The statements in this section merely provide background information related to the present disclosure and may not constitute prior art.

RF power generators can be used in industrial applications such as fabricating integrated circuits. In these applications the RF generator is a critical element of the manufacturing process. The RF generator also interfaces with a number of other elements such as sensors, matching networks, a plasma chamber, and so forth. As such, it can be expensive, time-consuming and/or technically challenging to remove and replace a failed RF generator.

Despite the apparent risks associated with a failed RF generator, modern RF generators have limited tolerance to faults or failures of internal components. For example, a single component failure in a sub-module of a RF generator can cause the RF generator to shut down. While shutting down the RF generator may be acceptable in applications that employ low power levels, e.g. up to 5 kW, it is less acceptable as power levels increase to manufacture larger-diameter silicon wafers. The limited tolerance to faults and/or failures can also cause an undesirably low mean time between failures (MTBF) in the high power RF generators.

Conventional RF generators typically have limited or no persistent storage for high speed events that happen in the instant before a hard failure occurs. This can result in extended resolution times for difficult system-level issues. Due to the high complexity of wafer processing tools, components in working order may be incorrectly determined to have caused irregular system. This may result in a properly operating RF generator being returned for repair when no problem exists, which can further decrease the MTBF statistics.

SUMMARY

According to some embodiments, radio frequency (RF) power generator including a driver module that generates RF power, a power amplifier module that amplifies the RF power and a compensator module. The compensator module includes a first communication port that receives diagnostic data associated with the power amplifier module. The compensator module saves the data that was received for a predetermined time prior to receiving a fault indication via the first communication port.

In various embodiments, the RF power generator further includes a control module that includes a second communication port and that determines an operating parameter of the power amplifier. A power supply control module includes a third communication port and determines an operating parameter of the power supply that provides power to the power amplifier. The RF power generator further includes a daisy-chain communication link that connects the first, second, and third communication ports.

In various embodiments, a radio frequency (RF) power generator includes a RF power amplifier module that generates a RF signal, a power supply that provides power to the power amplifier, and a control module that includes a first communication port and that determines an operating parameter of the power amplifier. A power supply control module includes a second communication port and determines an operating parameter of the power supply. A daisy-chain communication link connects the first and second communication ports.

According to some embodiments, a radio frequency (RF) power generator includes a driver module that generates RF power, a power amplifier module that amplifies the RF power, and a power supply module that provides power to the power amplifier module. A power supply control module includes a first communication port and that limits an output parameter of the power supply module based on receiving a fault indication via the first communication port.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
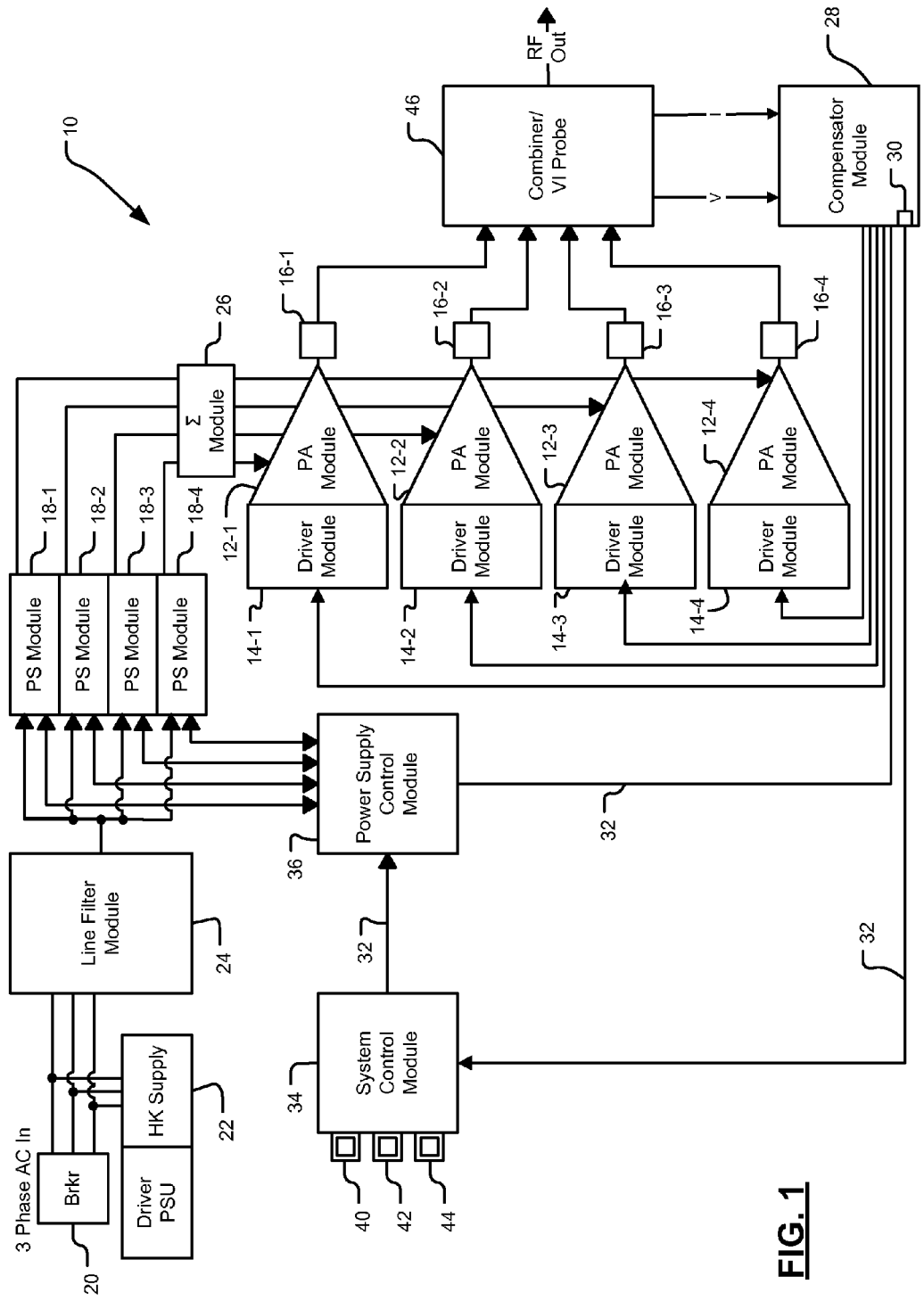
FIG. 1 is a functional block diagram of an improved RF generator.

The following description is merely exemplary in nature and is not intended to limit the present disclosure, application, or uses. It should be understood that throughout the drawings, corresponding reference numerals indicate like or corresponding parts and features.

Referring now to FIG. 1, one of several embodiments is shown of a RF generator 10. RF generator 10 includes a plurality of power amplifier modules or power amplifiers 12-1, 12-2, 12-3, and 12-4, collectively referred to as power amplifier 12. Each power amplifier of power amplifier 12 includes a respective power transistor or driver module 14-1, 14-2, 14-3, and 14-4, collectively referred to as power transistor 14. Output of power amplifier 12 can communicate with respective inductive clamping circuits 16-1, 16-2, 16-3, and 16-4, collectively referred to as inductive clamping circuit 16. This convention for referencing similar components will be used throughout this specification. Clamping circuit 16 protects power transistor 14 from load transients and also limits the power that power transistor 14 can deliver into very low impedance loads. In some embodiments, clamping circuit 16 can be included in respective power amplifier 12.

In some embodiments, each power amplifier 12 employs a push-pull parallel power amplifier topology. In other embodiments, power amplifier 12 employs a half-bridge amplifier topology. It will be recognized by one skilled in the art that a variety of power amplifier topologies can be used to implement power amplifier 12. For example, power amplifier 12 can also employ power transistor 14 with air cavity packaging. The air-cavity packaging allows one transistor of power transistor 14 to fail short while the remaining amplifiers of power amplifier 12 continue to operate. When an individual transistor of power transistor 14 fails short in an air-cavity package the wire bonds fuse open within the package. The open wire bonds effectively disconnect the shorted individual power transistors of power transistor 14 from the other power transistors of power transistor 14 and allow them to continue operating, such operation occurring at possibly increased electrical and thermal stresses.

A plurality of power supply modules define a power supply module 18 to convert AC power to DC power for power amplifier 12. The AC power can be 3-phase power provided through circuit breaker 20. The AC power can also be applied to a housekeeping power supply module 22 that generates power in conjunction with a driver power supply unit (PSU) for various modules of RF generator 10. A line filter module 24, such as for filtering electromagnetic interference or other typical interference, can also be employed to filter the AC power.

Power supply module 18 feeds DC current to a summing module 26. Summing module 26 sums the input DC currents and/or voltages and communicates the summed current and/or voltages to power amplifier 12. In some embodiments, summing power supply 18 and/or module 26 can also include a filter network that filters the summed current that is provided to power amplifier 12. If one power supply of power supply module 18 fails, then summing module 26 can disconnect the failed power supply module and thereby allow RF generator 10 to continue operating.

A compensator module 28 acquires, buffers, and/or determines data such as process variables and/or respective set points, current and/or voltage provided to power amplifiers 12, current and/or voltage provided by power amplifiers 12, and/or temperatures of various elements and/or ambient air. The acquired data may be temporarily or somewhat permanently stored in a trace buffer. Compensator module 28, in various embodiments, determines complex load impedance and delivered load power and outputs control signals to driver module 14 to vary operation of power amplifier module 21 to thereby adjust the RF output power from combiner/VI probe 46. Compensator module 28, in some embodiments, compares the data to corresponding predetermined limits and indicates a fault condition when the limits are violated. Compensator module 28, in various embodiments, stores the acquired data for analysis. In some embodiments, compensator module 28 includes a communication port 30 for storing and/or retrieving the buffered data. Communication port 30 can employ a communication link 32, such as Ethernet, RS-232, wireless or other type of interface and/or protocol.

In some embodiments, communication link 32 provides communication paths between compensator module 28 and other modules such as system control module 34 and power supply control module 36. Communication link 32 can employ high speed, error-corrected digital links that are connected in a daisy chain fashion. The daisy chain connections reduce the amount of cabling when compared to other connection topologies such as star and/or bus and therefore can improve the reliability of RF generator 10.

System control module 34 includes an interlock 40 port, a second communication port 42, and a customer interface 44. Interlock 40 is an input that inhibits RF generator 10 from generating RF power under certain conditions. For example, interlock 40 receives signals that indicate a shutdown condition and can act upon those signals to disable high power components in RF generator 10. System control module 34 can also include a customer interface 48 that can be used to control and/or communicate various parameters of RF system 10.

Power supply control module 36 controls power supply modules 18 in accordance with commands from system control module 34 and/or compensator module 28. Power supply control module 36 includes a communication port communicating with communication link 32. If power supply module 36 receives a fault indication, such as via communication link 32, then, in some embodiments, it limits an output power of one or more power supply modules 18 to protect power amplifiers 12 from damage. The fault response aspects of power supply control module 36 can cooperate with clamping circuits 16 to further protect power amplifiers 12. In some embodiments, the response time to a fault condition is faster for clamping circuits 16 than for power supply control module 36.

Clamping circuit 16 outputs an RF signal. The RF signal passes through a combiner/VI probe 46. Combiner/VI probe 46 combines the respective RF outputs from clamping circuit 16 to generate a combined RF output. The VI probe portion of combiner/VI probe 46 is implemented in some embodiments as an integrated broadband VI probe. The VI probe provides sensed voltage and current signals to data compensator module 28. The VI probe enables practical instantaneous determination of power and load impedance at relatively high rates of speed while rejecting undesirable signals such as intermodulation distortion products. The improved speed enables the control system to better react to load fluctuations to further increase reliability. Examples of the VI probe can be found with reference to U.S. Pat. Nos. 5,508,446 and 6,522,121, both of which are incorporated herein in their entirety.

Figure 2:
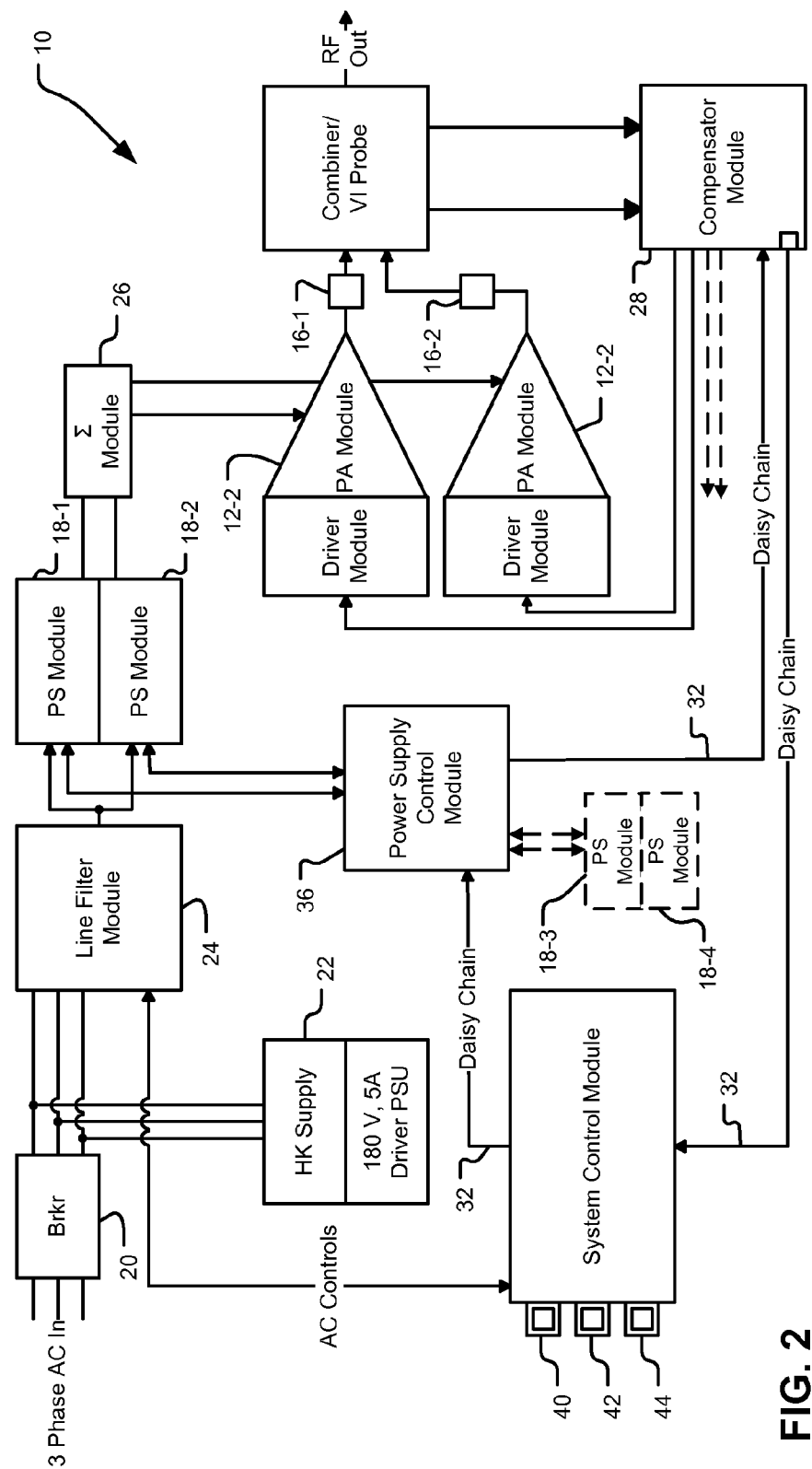
FIG. 2 is a functional block diagram of an second embodiment of an improved RF generator.

FIG. 2 depicts various embodiments of RF generator 10. RF generator 10 of FIG. 2 may be used to implement a lower-power configuration than RF generator 10 shown in FIG. 1. RF generator 10 includes power amplifier 12, having a pair of power amplifiers, and an associated driver module 14 and clamping circuit 16. The embodiments of RF generator 10 that are shown in FIGS. 1-2 demonstrate the scalable nature of the architecture of RF generator 10. In particular, power supply modules 18-3 and 18-4, shown in phantom, represents a pair of power supply modules and accompanying power amplifier circuitry from FIG. 1 that have been omitted in FIG. 2 and indicates that the system of FIG. 1 has been scaled down. Likewise, a pair of control lines output from compensator module 28 appear in phantom to further demonstrate the scalable nature of the design.

Figure 3:
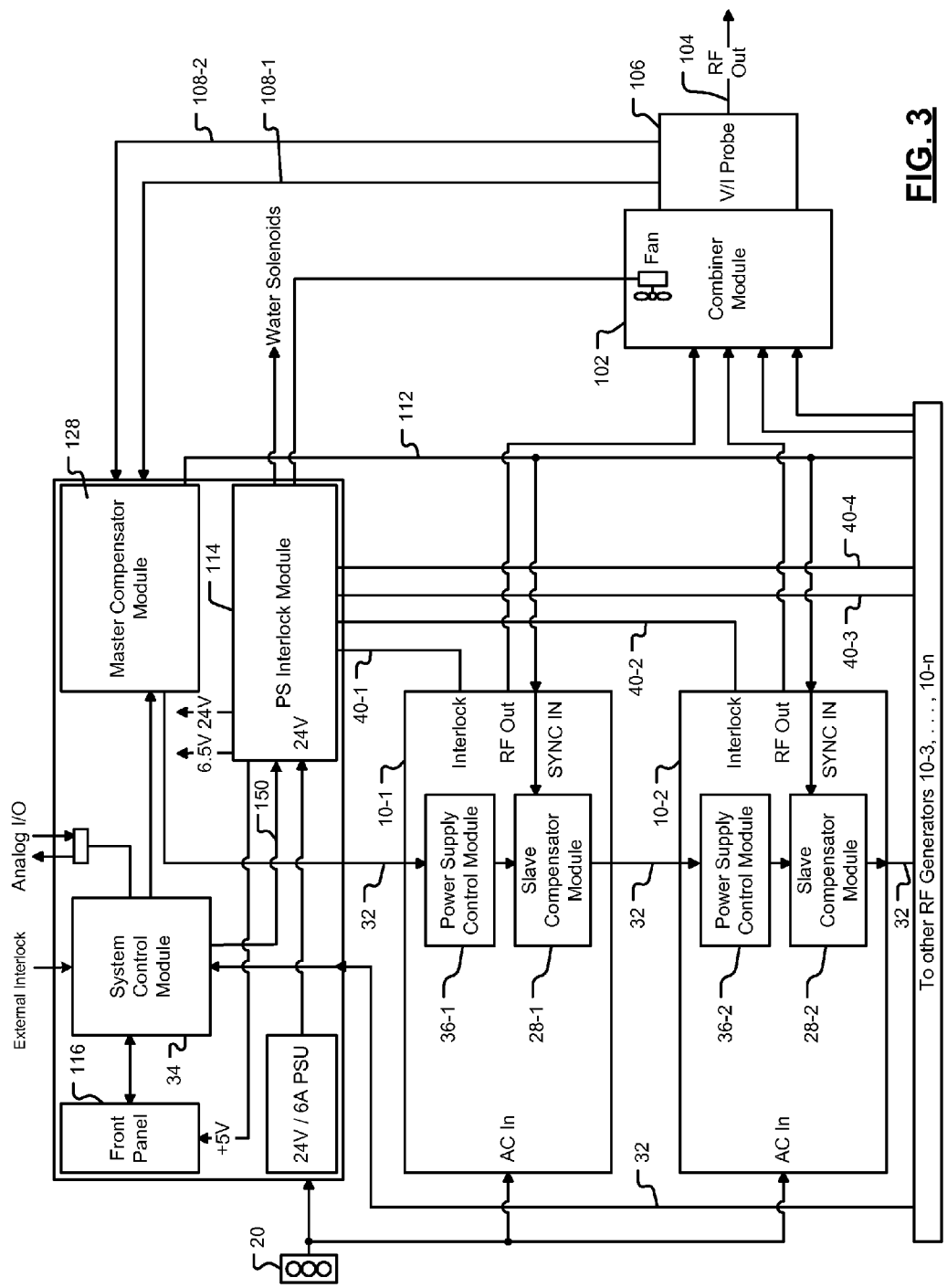
FIG. 3 is a functional block diagram of an RF power generator that includes a combiner for combining power generated by a plurality of RF power generators.

FIG. 3 depicts various embodiments of RF system 100. RF system 100 includes a plurality of RF generators 10-1, 10-2, ..., 10-n, collectively referred to as RF generator 10. RF system 100 combines energy from the plurality of RF generators 10 to create a RF signal. In some embodiments, each RF generator 10 develops approximately 13 kW of RF power. The outputs of the RF generators 10 are then combined to generate between 20-40 kW at the output of RF system 100. FIG. 3 can be implemented, by way of example, as an integrated rack system.

FIG. 3 further demonstrates the scalable nature of the system described herein. In FIG. 3, the RF generator units 10 of either FIG. 1 or FIG. 2 are implemented as basic elements in a system which combines the output of two or more RF generators 10 to produce an increased output power. In FIG.

3, the RF generator modules 10 are substantially the same. A single system control module 34 of FIGS. 1 and 2 controls the RF generators 10 of FIG. 1.

Each RF generator 10 includes, in some embodiments, a respective power supply module 18, driver module 14, power amplifier 12, and associated support circuitry. Compensator 28 from FIG. 1 or 2 appears in respective RF generators 10-1 and 10-2 as slave compensator module 28-1 and 28-2. Slave compensator module 28 of FIG. 3 operates similarly as described with respect to FIGS. 1 and 2. Each slave compensator module 28 monitors the respective outputs of the combiner/VI probe 46 (not shown in FIG. 3) and generates adjustment signals to driver module 14 to control a respective PA module 12, (not shown in FIG. 3). Slave compensator module 28 also receives input from a master compensator module 128. Master compensator module 128 receives inputs, as will be described further herein, and generates output signals to slave compensator modules 28-1 and 28-2. System control module 34 operates similarly as described above with respect to FIGS. 1 and 2.

Each RF generator 10 outputs a RF signal to a combiner module 102, which operates as described above to combine the RF outputs and generate a single RF output. The single RF output is communicated to VI probe 106. VI probe 106 generates output signals 108-1 and 108-2 which correspond to the voltage and current in the RF output signal 104. Master compensation module 128 receives the voltage and current signals and generates output signals 112 to each slave compensator modules 128-1 and 128-2.

A power supply interlock module 114 communicates with each of RF generators 10 via interlock line 40. Power supply interlock module 114 monitors conditions that would require disabling RF generators 10. By way of non-limiting example, an interlock signal may be input to power supply interlock module 114 if an exposed RF connection is detected. In such an instance, power supply interlock module 114 generates signals to disable a RF generator 10. Power supply interlock module 114 also receives an external interlock signal passed through system control module 34. Power supply interlock module 114 communicates with system control module 34 via line 150 to also receive signals from system control module 34 that power supply interlock module 114 utilizes to control the water solenoids. By way of non-limiting example, if a condensation condition is detected by system control module 34, system control module generates signals to power supply interlock module 114 to disable water solenoids in order to limit possible condensation within the housing for RF generator 100. In some embodiments, system control module 34 and power supply interlock module 114 also communicate with a front panel 116 in order to provide information to the system operator.

What is claimed is:

1. A radio frequency (RF) power generator configured to:
    generate RF power;
    amplify the RF power using a power amplifier module; and
    communicate with an RF output of the power amplifier module, and that receives and stores diagnostic data associated with the power amplifier module, wherein
    the RF power generator includes a first digital communication port,
    the RF power generator stores the diagnostic data that was received for a predetermined time prior to determining that the stored diagnostic data is indicative of a fault condition of the RF power generator,
    the RF power generator communicates a fault indication using the first digital communication port when the stored diagnostic data is indicative of the fault condition, and
    the RF power generator provides the stored diagnostic data after determining that the stored diagnostic data is indicative of the fault condition using the first digital communication port.

2. The RF power generator of claim 1 wherein the diagnostic data includes at least one of a voltage, a current, a phase angle, a temperature and a process variable.

3. The RF power generator of claim 1 further comprising an inductive clamping circuit in communication with the RF output of the power amplifier module.

4. The RF power generator of claim 3 further comprising a power supply that provides power to the power amplifier module.

5. The RF power generator of claim 4 wherein the RF power generator limits a power delivered by the power supply based on the fault indication.

6. The RF power generator of claim 5 wherein the inductive clamping circuit limits a load applied to the power amplifier module.

7. The RF power generator of claim 1 wherein the power amplifier module includes an air-cavity transistor package.

8. The RF power generator of claim 1 further comprising a voltage and current (V/I) probe that generates a signal based on the voltage and current of amplified RF power at an output of the power amplifier module.

9. A radio frequency (RF) power generator configured to:
    generate RF power;
    amplify RF power using a power amplifier module;
    provide power to the power amplifier module; and
    limit an output parameter based on receiving a fault indication via a first communication port; and
    communicate with an RF output of the power amplifier module, that receives diagnostic data indicative of a fault condition of the RF power generator, that stores the diagnostic data for a predetermined time prior to determining that the stored diagnostic data is indicative of the fault indication, that communicates the fault indication on a second communication port, and that provides the stored diagnostic data after determining that the stored diagnostic data is indicative of the fault condition using the second communication port, wherein the diagnostic data includes at least one of a voltage, a current, a phase angle, a temperature and a process variable, and wherein the RF power generator receives the diagnostic data on an input port other than the second communication port.

10. The RF power generator of claim 9 further comprising an inductive clamping circuit that communicates with the RF output of the power amplifier module and that limits a load applied to the power amplifier module.

11. The RF power generator of claim 9 wherein the power amplifier module includes an air-cavity transistor package.

12. The RF power generator of 9 further comprising:
    a third communication port and that determines an operating parameter of a power amplifier; and
    a daisy-chain communication link that connects the first, second, and third communication ports.

13. The RF power generator of claim 9 further comprising a voltage and current (V/I) probe in communication with the RF output of the power amplifier module.

* * * * *